United States Patent
Woong et al.

(10) Patent No.: US 7,332,969 B2
(45) Date of Patent: Feb. 19, 2008

(54) OUTPUT OFFSET PROTECTION FOR POWER AMPLIFIER

(75) Inventors: Chew Yuan Woong, Singapore (SG); Yasuo Higuchi, Singapore (SG)

(73) Assignees: Matsushita Electric Industrial Co., Ltd., Osaka (JP); Panasonic Semiconductor Asia Pte., Ltd., Singapore (SG)

( * ) Notice: Subject to any disclaimer, the term of this patent is extended or adjusted under 35 U.S.C. 154(b) by 194 days.

(21) Appl. No.: 11/262,996

(22) Filed: Oct. 31, 2005

(65) Prior Publication Data

US 2007/0096829 A1    May 3, 2007

(51) Int. Cl.
    *H03F 1/52*    (2006.01)
(52) U.S. Cl. .................................. 330/298; 330/207 P
(58) Field of Classification Search ............ 330/207 P, 330/298
    See application file for complete search history.

(56) References Cited

U.S. PATENT DOCUMENTS 5,818,301 A * 10/1998 Higashiyama et al. ...... 330/266
6,188,277 B1 * 2/2001 Borodulin et al. ............ 330/51
7,030,700 B2 * 4/2006 Wong et al. ................. 330/298
2003/0160653 A1   8/2003 Hasegawa

FOREIGN PATENT DOCUMENTS

JP    2003258575    9/2003

* cited by examiner

*Primary Examiner*—Robert Pascal
*Assistant Examiner*—Alan Wong
(74) *Attorney, Agent, or Firm*—Harness, Dickey & Pierce, PLC

(57) ABSTRACT

A output offset protection circuit provides protection of the load and the power amplifier through monitoring the temperature of the power transistor in the operational amplifier to detect fault conditions of an output block. In the output offset protection circuit, a sensor block monitors the temperature differences between the power transistors, while the output block is driving the load. Upon detection of the temperature differences reaching a 1st threshold level, the cutoff block sends a cutoff signal to a protection switch block, and the hysteresis block is activated. The hysteresis block shifts the threshold level lower to the 2nd threshold level. The sensor block continues to monitor the temperature differences until the 2nd threshold level is reached. Then the cutoff block is deactivated.

6 Claims, 5 Drawing Sheets

OUTPUT OFFSET PROTECTION FOR POWER AMPLIFIER

BACKGROUND OF THE INVENTION

The present invention relates to a power amplifier to provide protection using temperature sensing, in the event of faults occurring, for examples, when the output terminal is shortcircuited to a constant potential causing an output offset across the load or when an abnormal output offset condition, such as leakage cause from the deterioration of the coupling capacitor or the characteristic of the amplifier varies due to the influence of an environment occurs, and it could cause a DC offset current to flow through the load, such as a speaker, and the heat generated when the offset current flows through a voice coil in the speaker damages the speaker. Therefore the protection circuits will forestall the offset-induced adverse affects or damage to the power amplifier and the load. An example of such protection circuits is disclosed in the U.S. Pat. No. 2003/0160653 A1.

In a power amplifier system, it is desirable to avoid operation in fault modes, which could result in permanent damage of the system, especially power transistors. In a conventional design, the protection circuits detect and judge the occurrence of an offset using external low-pass filter and control unit.

FIG. 5 shows a prior art power amplifier system having an arrangement of protection to prevent a load, such as a speaker, from being damaged. The power amplifier system comprises a power amplifier 9 an electronic volume circuit 10, a coupling capacitor 11, a low-pass filter 12, a control unit 13 and a display unit 14.

The power amplifier 9 is provided with a non-inverting amplifying circuit 16 for applying non-inverting amplification to an audio signal supplied at the input terminal Q0 from the electronic volume circuit 10 through the coupling capacitor 11, an inverting amplifying circuit 17 for applying inverting amplification to the audio signal, a power amplifying circuit 18 for amplifying the audio signal from the non-inverting amplifying circuit 16, and another power amplifying circuit 19 for amplifying the audio signal from the inverting amplifying circuit 17.

The output contacts of the power amplifying circuits 18 and 19 are connected, respectively, to the output terminals Q1 and Q2 through switch elements 20 and 21. The output voltage S1 from the power amplifying circuits 18 and an output voltage S2 from the power amplifying circuits 19 are provided to a differential voltage detecting unit 22 for generating a differential voltage signal S12 for detecting an offset. The differential voltage detecting unit 22 has a differential amplifier for calculating a difference between the output voltages S1 and S2 and a comparator for comparing the voltage level of a difference signal (S1-S2) outputted from the differential amplifier with a certain threshold voltage VTHD. The comparator compares the threshold voltage VTHD with the differential signal (S1-S2), and outputs the differential voltage signal S12 in a duty ratio corresponding to the difference (S1-S2).

The low-pass filter 12 has a band as high as or lower than the audio band, and generates a detection signal Vdet of a DC voltage by smoothing the differential voltage signal S12 outputted from the outside output terminal Q4. The detection signal Vdet is supplied to the control unit 13.

The control unit 13 performs basic control. For example, control unit 13 adjusts a volume of the speaker 15 by receiving command information supplied from an operation panel or the like manipulated by the user, thereby controlling an operation of the electronic volume circuit 10 at a command from the users. The control unit 13 not only performs the basic control, but also pre-sets a threshold voltage Vok which is used for detecting the absence/presence of an offset. The threshold voltage Vok is determined in advance in consideration of a practically allowable offset voltage.

The control unit 13 compares the voltage level of the detection signal Vdet with the threshold voltage Vok, and judges the absence of an offset in the outputs from the power amplifying circuits 18 and 19 when the voltage level of the detection signal Vdet is higher than the threshold signal Vok. Conversely, control unit 13 detects the presence of an offset in the outputs from the power amplifying circuits 18 and 19 when the voltage level of the detection signal Vdet is equal to or lower than the threshold voltage Vok.

Upon judging the presence of an offset, the control unit 13 supplies a switching control signal to the switch elements 20 and 21 through the outside input terminal Q3, and brings the switch elements 20 and 21 into a non-conductive state (OFF state) to cut the connection between the power amplifying circuits 18 and 19 and the speaker 15. Upon judging the absence of an offset, the control unit 13 maintains the switch elements 20 and 21 in conductive state (ON state). The control unit 13 supplies signal to the switch display unit 14 to display a warning.

In this conventional design, the judgment of the occurrence of the offset and the control of the protection is accomplished by detecting the differential voltage, applying the detected differential voltage through the external LPF 12 and control unit 13 and feeding the switching control signal back to the power amplifier 9. This is operation is very slow and would stressed the power amplifier 9 and the speaker 15 before the protection starts. Thus, the performance is deteriorated.

SUMMARY OF THE INVENTION

An object of the present invention is to provide a power amplifier with an efficient protection system, using temperature sensing. The protection system protects output block including a power transistor and the load such as a speaker. Thus, damages which may occur when the output terminal is shortcircuited to a constant potential or when an abnormal output offset is produced, can be avoided, and giving no affect to the original performance.

According to the present invention, a power amplifier circuit having a protection circuit comprises: a first power transistor provided in a first amplifier; a second power transistor provided in a second amplifier; a bias block operable to provide a bias signal to said first and second amplifiers; a protection switch provided in a path for sending the bias signal; a protection switch block operable to provide a control signal to the protection switch; and an output offset protection circuit operable to provide a cutoff signal which causes the generation of said control signal. The output offset protection circuit comprises: a first temperature sense transistor located near said first power transistor to generate a temperature sense signal when said first power transistor is heated above a predetermined temperature; a second temperature sense transistor located near said second power transistor to generate a temperature sense signal when said second power transistor is heated above a predetermined temperature; and a cutoff block for generating a cutoff signal when at least one of said first and second temperature sense transistors generates a temperature sense signal.

According to a preferred embodiment, the output offset protection circuit further comprises: a judging device that determines a first predetermined temperature for turning on said first and second temperature sense transistors.

According to a preferred embodiment, the output offset protection circuit further comprises: a hysteresis block operable to provide a bypass circuit for the first and second temperature sense transistors thereby determining a second predetermined temperature for turning off said first and second temperature sense transistors, said second predetermined temperature being lower than said first predetermined temperature.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENTS

The following description explains the best mode embodiment of the present invention.

Figure 1:
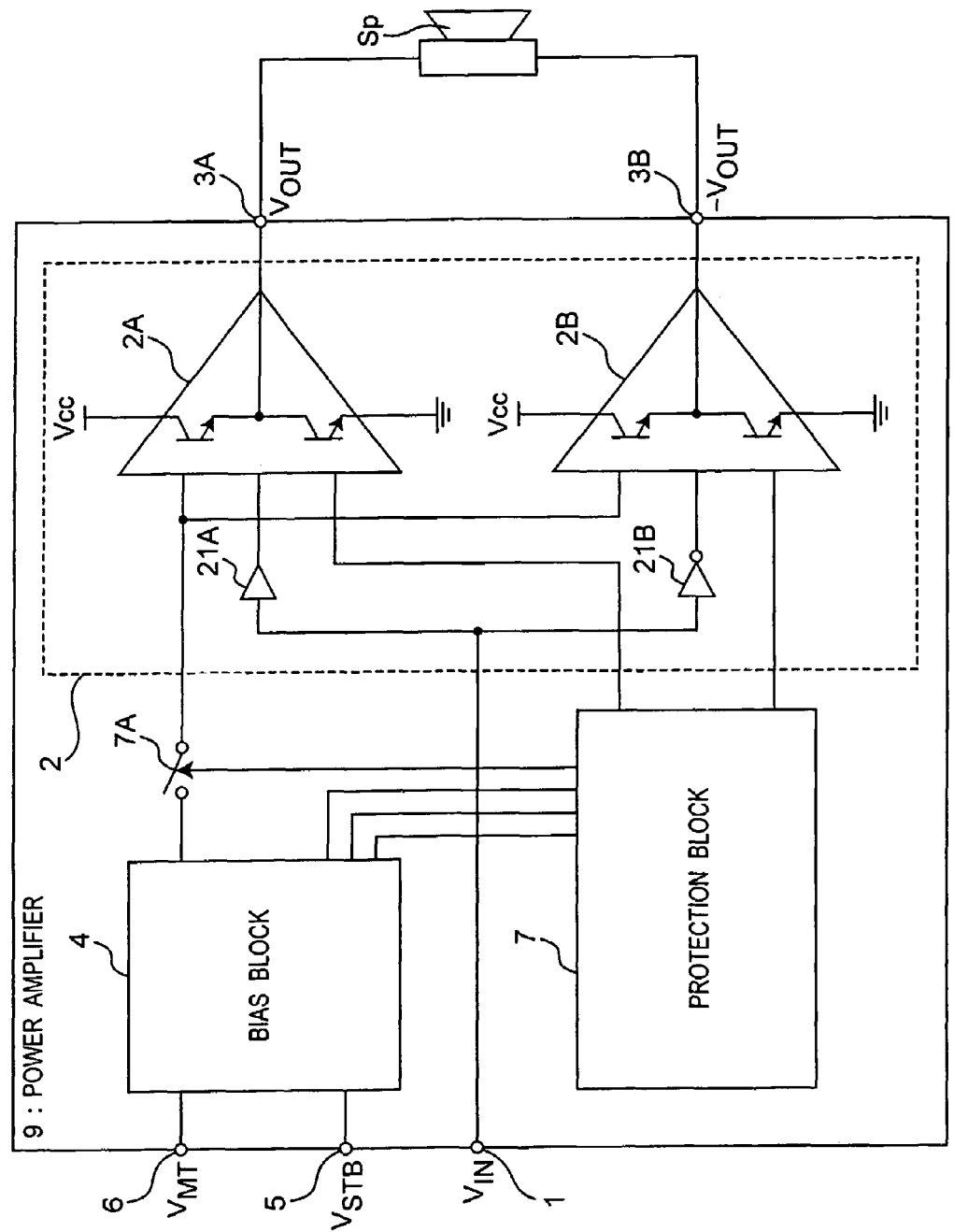
FIG. 1 is a block diagram showing a BTL (Balanced Transformer Less) configuration of a power amplifier according to the present invention.

FIG. 1 shows a preferred embodiment of a BTL (Balanced Transformer Less) configuration of a power amplifier 9 according to the present invention. The power amplifier 9 is preferably an audio power amplifier for driving a loudspeaker Sp. The power amplifier 9 comprises an input terminal 1, an output block 2, first and second output terminals 3A and 3B, a bias block 4, a standby pin 5, a mute pin 6 and a protection block 7.

The input terminal 1 receives audio signals $V_{IN}$ from an outside device, for example, a microcontroller. The output block 2 includes first and second operational amplifiers 2A and 2B, a buffer 21A, and an inverter 21B. The audio signals $V_{IN}$ pass through the buffer 21A and the inverter 21B, and enter the first operational amplifier 2A and the second operational amplifier 2B, respectively, in opposite phases. The first and second operational amplifiers 2A and 2B are a push-pull type, that is, each of them includes a pair of power transistors connected in series between a power supply (with a positive voltage $V_{CC}$) and a ground (or a negative potential voltage $V_{EE}$) The first and second output terminals 3A and 3B, each is at an intermediate junction between the respective pairs of the power transistors, are connected to the loudspeaker Sp. The first and second operational amplifiers 2A and 2B transform the audio signal $V_{IN}$ to a pair of output voltages $V_{OUT}$ and $-V_{OUT}$ in opposite polarities at the first and second output terminals 3A and 3B, respectively. Then, double the output voltage $V_{OUT}$ is applied across the loudspeaker Sp.

The bias block 4 provides bias currents to other blocks, thereby biasing the other blocks in activated states. The bias block 4 monitors the state of the standby pin 5, and starts (or terminates) the biasing upon activation of the standby pin 5. A bias current or bias signal is also provide to the output block 2. A protection switch 7A is inserted in a path for sending the bias signal to the output block 2.

The protection block 7 detects fault conditions of the power amplifier 9. The fault conditions include, for example, a shortcircuit at one of the output terminals 3A and 3B to a constant potential, resulting in an abnormal load condition. Upon detection of the fault conditions, the protection block 7 generates a control signal that turns off a protection switch 7A, thereby cutting off the output block 2 from the bias block 4. Accordingly, the output block 2 is prevented from maintaining the conductive state under the fault conditions, and thus output block 2 is protected from being damaged by the fault conditions.

Figure 2:
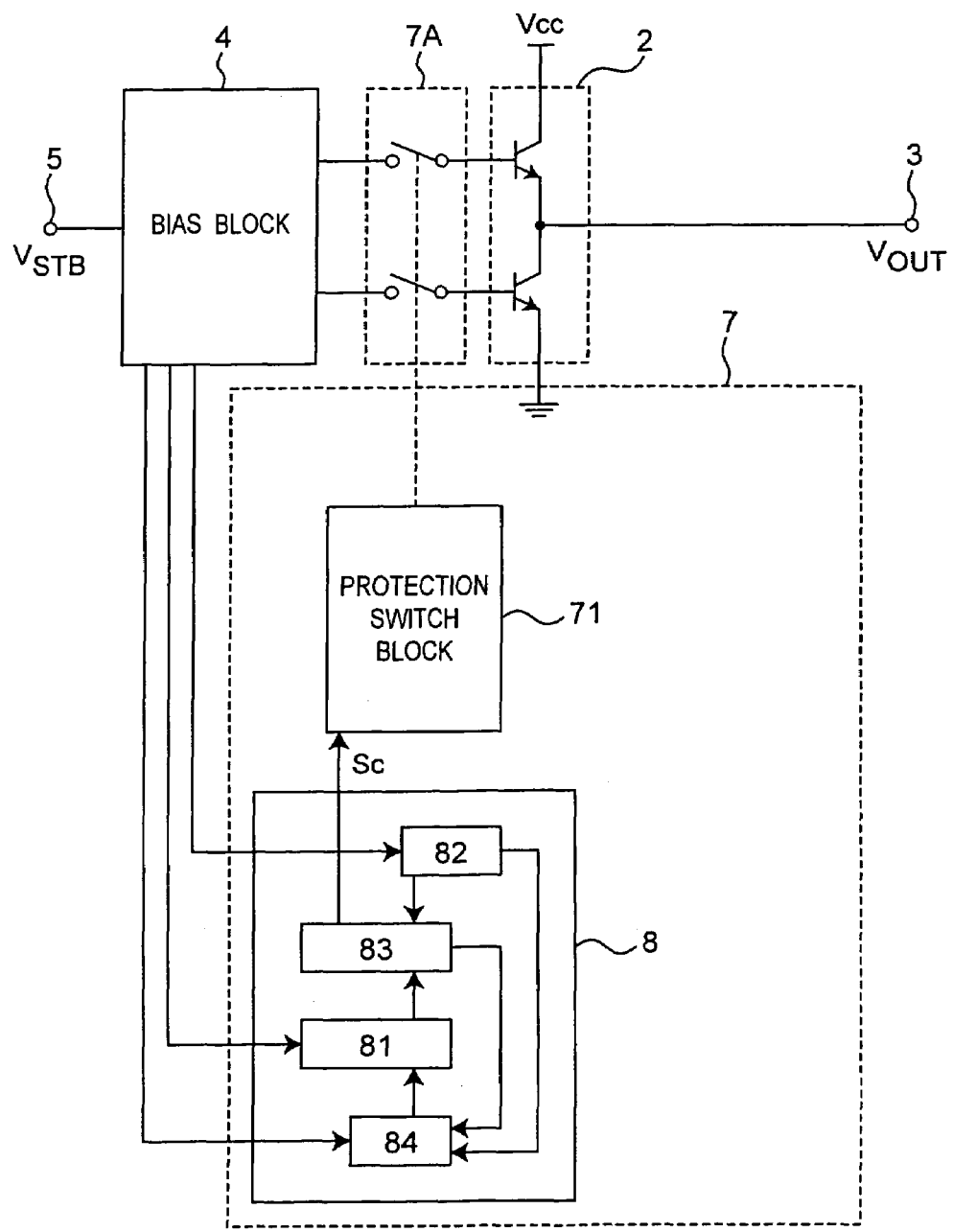
FIG. 2. is a block diagram showing a detail of a protection block.

FIG. 2 shows the configuration of the power amplifier 9 showing the structure of protection block 7. The protection block 7 includes a protection switch block 71, and an output offset protection circuit 8.

The protection switch block 71 generates a control signal which controls the ON/OFF states of protection switch 7A. Protection switch 7A shown as having two switching elements are interposed between the output block 2 and the bias block 4, and are used for allowing (or prohibiting) bias currents. In particular, upon reception of a cutoff signal Sc produced from the output offset protection circuit 8 in the protection block 7, the protection switch block 71 generates a control signal that turns off the protection switch 7A.

Figure 3:
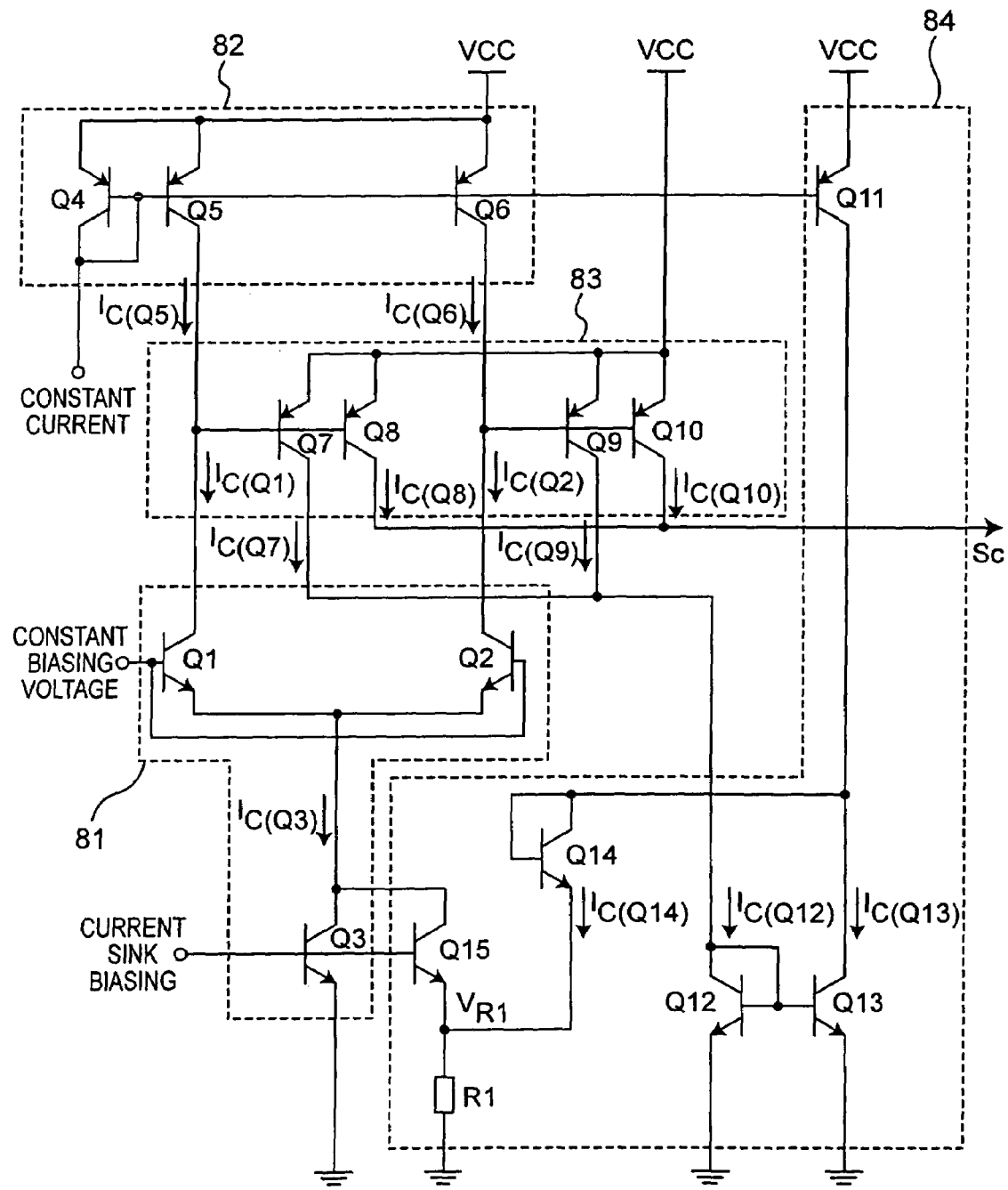
FIG. 3 is a circuit diagram of an output offset protection circuit accordint to a preferred embodiment of the invention.

FIG. 3 shows a circuit diagram of the output offset protection circuit 8 according to a preferred embodiment. The output offset protection circuit 8 includes a sensor block 81, a judging device 82, a cutoff block 83, and a hysteresis block 84.

The sensor block 81 comprises three NPN transistors Q1, Q2 and Q3. The NPN transistor Q1 is a temperature sense transistor that is placed near the upper power transistors located inside the operational amplifier 2A, while the NPN transistor Q2 is a temperature sense transistor that is placed near the lower power transistors located inside the operational amplifier 2B. The base of the two NPN transistors Q1 and Q2 are connected to a constant biasing voltage. The emitter of the two NPN transistors Q1 and Q2 are connected to each other and are connected to the collector of transistor Q3. The NPN transistor Q3 is a current sink that will draw a constant biasing current from the NPN transistor Q1 and Q2. The collector current of the two NPN transistors Q1 and Q2 ($I_{C(Q1)}$, $I_{C(Q2)}$) will be the same under normal operation. Thus, the collector current of transistor Q1 or Q2 is equal to a half of the collector current that is drawn by the NPN transistor Q3 ($I_{C(Q3)}$). However, when a fault condition of the power transistor in the operational amplifier 2A or 2B should take place, a temperature of the power transistor increases. It is assumed that the upper power transistors in operational amplifier 2A is overloaded and the temperature thereof in increased. In this case, the collector current of NPN transistor Q1 ($I_{C(Q1)}$) increases, and the collector current of the NPN transistor Q2 is maintained the same, or is decreased.

The judging device 82 comprises three PNP transistors Q4, Q5 and Q6. The three PNP transistors Q4, Q5, and Q6 set a threshold level of the output offset protection circuit 8. The emitters of the three PNP transistors Q4, Q5 and Q6 are connected to the power supply Vcc. The base and collector of the PNP transistor Q4 are connected to the bases of the two PNP transistors Q5 and Q6. Accordingly, the collector currents of the two PNP transistors Q5 and Q6 ($I_{C(Q5)}$, $I_{C(Q6)}$) are mirrored from the collector current of the PNP transistor Q4 ($I_{C(Q4)}$) to provide a constant current to the sensor block 81.

The cutoff block 83 comprised four PNP transistors Q7, Q8, Q9 and Q10. The emitters of the four PNP transistors Q7, Q8, Q9 and Q10 are connected to the power supply Vcc. The bases of the two PNP transistors Q7 and Q8 are connected to the collector of the PNP transistor Q5 of the judging device 82, and also to the collector of the NPN transistor Q1 of the sensor block 81. The bases of the two PNP transistors Q9 and Q10 are connected to the collector of PNP transistor Q6 of the judging device 82, and also to the collector of the NPN transistor Q2 of the sensor block 81.

The hysteresis block 84 comprises a PNP transistor Q11 four NPN transistors Q12, Q13, Q14, and Q15 and a resistor R1. The emitter of the PNP transistor Q11 is connected to the power supply Vcc. The base of the PNP transistor Q11 is connected to the base and collector of the PNP transistors Q4 of the judging device 82. Accordingly, the collector current of the PNP transistors Q11 ($I_{C(Q11)}$) is mirrored from the emitter current of the PNP transistor Q4 ($I_{C(Q4)}$), therefore is able to provide a constant current. The emitter of two NPN transistors Q12 and Q13 are connected to the ground, while the base of the NPN transistor Q13 is connected to the base and collector of the NPN transistor Q12. The two NPN transistors Q12 and Q13 form a current mirror to make the collector current of PNP transistor Q7 and Q9 ($I_{C(Q7)}$, $I_{C(Q9)}$) of the cutoff block 83 to be the same as collector current of NPN transistor Q13. The base and collector of the NPN transistor Q14 are connected to the collector of the PNP transistor Q11 and also to the collector of the NPN transistor Q13. The emitter of the NPN transistor Q14 is connected to the emitter of NPN transistor Q15 and also to one end of the resistor R1. The other end of the resistor R2 is connected to ground. In normal operations, the NPN transistor Q15 is off. Under fault condition, NPN transistor Q15 turns on to act as a current sink that will draw a constant collector current from the NPN transistor Q1 and Q2 ($I_{C(Q1)}$, $I_{C(Q2)}$) of the sensor block 81.

In operation, when the upper power transistor in operational amplifier 2A is overloaded and is heated above a predetermined temperature, the temperature sense transistor Q1 generates a temperature sense signal which is applied to transistor Q8 to generate the cutoff signal Sc. The temperature sense signal is also applied to transistor Q7 to activate the hysteresis block 84. When the hysteresis block 84 is activated, transistor Q15 turns on to share the collector current $I_{C(Q1)}$ of Q1 between transistors Q3 and Q15. When the upper power transistor is cooled down, the temperature sense transistor Q1 terminates generating the temperature sense signal. Thus, the cutoff signal Sc is terminated, resulting in termination of the control signal.

Similarly, when the lower power transistor in operational amplifier 2B is overloaded and is heated above a predetermined temperature, the temperature sense transistor Q2 generates a temperature sense signal which is applied to transistor Q10 to generate the cutoff signal Sc. The temperature sense signal is also applied to transistor Q9 to activate the hysteresis block 84. When the hysteresis block 84 is activated, transistor Q15 turns on to share the collector current $I_{C(Q2)}$ of Q2 between transistors Q3 and Q15. When the lower power transistor is cooled down, the temperature sense transistor Q2 terminates generating the temperature sense signal. Thus, the cutoff signal Sc is terminated, resulting in termination of the control signal. The operation is further explained in detail below. In normal operation, the cutoff block 83 is off, so there is no current from the PNP transistor Q7, Q8, Q9 and Q10. Since there is no current from Q8 and Q10, no cutoff signal Sc is generated. Thus, the protection switch block 71 is not activated. The current mirror formed by Q12 and Q13 of the hysteresis block 84 is also not operating because there is no current from Q7 and Q9 of the cutoff block 83. Since the current mirror (Q12 and Q13) is not operating, all the collector current of Q11 ($I_{C(Q11)}$) will flow through Q14 and will create a voltage across the resistor R1 ($V_{R1}$). This voltage across R1 ($V_{R1}$) will decrease the voltage across the base and emitter of Q15 ($V_{BE(Q15)}$) and therefore the NPN transistor Q15 will be off. Since there is no current from Q15 therefore $$I_{C(Q1)}=I_{C(Q2)}=(1/2)I_{C(Q3)}$$

and $$I_{C(Q1)}<I_{C(Q4)}, I_{C(Q2)}<I_{C(Q4)},$$

therefore $$I_{C(Q1)}=I_{C(Q5)}$$

and $$I_{C(Q2)}=I_{C(Q6)}.$$

When a fault condition occurs resulting in a huge positive offset at the output terminal 3A, there is a huge constant current flowing across the upper power transistors in operational amplifier 2A, resulting in the temperature around the upper power transistors to increase. The temperature sense transistor Q1 of the sensor block 81 will detect this increase in temperature of the upper transistor and will increase the collector current ($I_{C(Q1)}$) of Q1 until it reaches the 1st threshold level (Vth1) ($I_{C(Q1)} \geq I_{C(Q4)}$). From the equation, $$V_{be} = \frac{KT}{q}\ln\frac{I_E}{I_s},$$

it is clearly stated that the emitter current (or collector current, assuming the base current is very small and negligible) and the base-emitter voltage across a transistor is dependant on the temperature. Under this fault condition, the temperature sense transistor Q1 will start to pull the current from Q7 and Q8 of the cutoff block. Thus, $$I_{C(Q1)}=I_{C(Q5)}+I_{B(Q7)}+I_{B(Q8)}$$

is obtained.

The pulling of current from the base of the two PNP transistors, Q7 and Q8 of the cutoff block 83, will activate the cutoff block 83. Thus, transistor Q8 will supply the cutoff signal Sc to the protection switch block 71, and transistor Q7 will supply current to Q12 of the hysteresis block 84. The collector current of Q12 ($I_{C(Q12)}$) is mirrored to the collector current of Q13 ($I_{C(Q13)}$) and it draws all the current from Q11. Then, transistor Q14 is off, and the voltage across the resistor R1 ($V_{R1}$) is reduced. Thus, the base and emitter of Q15 ($V_{BE(Q15)}$) increases to turn transistor Q15 on. Thus, transistor Q15 serves as a current source to supply additional current to the temperature sensing transistor Q1 and Q2 of the sensor block 81. When the hysteresis block 84 turns on, a relationship $$I_{C(Q1)}+I_{C(Q2)}=I_{C(Q3)}+I_{C(Q15)}$$

is obtained, wherein $I_{C(Q1)}$ is greater than $I_{C(Q2)}$.

In response to the cutoff signal Sc, the protection switch block 71 produces the control signal to turn on the protection switch 7A. Thus, the bias currents from the bias block 4 are prohibited from flowing to the output block 2. Since the bias current is not flowing across the upper power transistor in operational amplifier 2A anymore, the temperature around the upper power transistor is reduced. Thus, the temperature sense transistor Q1 of the sensor block 81 detects the reduction in temperature of the upper power transistor, resulting in reduction of the collector current ($I_{C(Q1)}$) of Q1. Then, when the collector current ($I_{C(Q1)}$) of Q1 reaches the 2nd threshold level (Vth2), i.e., when $I_{C(Q1)} < I_{C(Q4)}$, transistor Q14 turns on to turn transistor Q15 off. The 2nd threshold level (Vth2) is lower than the 1st threshold level (Vth1), so the hysteresis is created. Once the collector current of the temperature sense transistor Q1 ($I_{C(Q1)}$) goes below the 2nd threshold level (Vth2), it stops pulling current from Q7 and Q8 of the cutoff block 83 and the cutoff signal Sc from the collector of the PNP transistor Q8 is terminated. The hysteresis block is de-activated and the output block 2 promptly recovers the normal operation without affecting the original performance of the power amplifier 9.

By the hysteresis block 84 the collector current $I_{C(Q1)}$ of Q1 flows through only transistor Q3 before transistor Q1 is turned on by the heat from the upper power transistor, but the the collector current $I_{C(Q1)}$ of Q1 flows through both transistors Q3 and Q15 in parallel after transistor Q1 is turned on. Thus, transistor Q15 serves as a bypass circuit. Since the collector current path of transistor Q1 changes before and after the turn on the of Q1, transistor Q1 is turned on when the power transistor is heated up above a first predetermined temperature, and is turned off when the power transistor is cooled down below a second predetermined temperature which is below the first predetermined temperature. Thus, undesirable oscillation of ON and OFF of transistor Q1 can be prevented. The same applies to the turn on and off of transistor Q2. The output offset protection circuit 8 can adjust the sensitivity of the turning on of the protection by adjusting the threshold level. The adjustment of the 1st threshold level (Vth1), corresponding to the first predetermined temperature, is accomplished by controlling the current sink Q3 of the sensor block 81, and controlling the constant current to the PNP transistor Q4 of the judging device 82. The adjustment of the recovery of the output offset protection circuit 8, i.e., the adjustment of the 2nd threshold level (Vth2), corresponding to the second predetermined temperature, is accomplished by controlling the resistance value of the resistor R1. Accordingly, the additional current provided by the NPN transistor Q15 can be changed. The threshold voltage is determined in advance in consideration of offset voltage being within the allowable range, so as to ensure the correct operation of the power amplifier 9.

The output offset protection circuit 8 differs from a typical thermal shutdown circuit in such a point that the output offset protection circuit 8 senses the temperature difference between the power transistors inside the operational amplifiers 2A and 2B, while the thermal shutdown circuit sense the temperature of the entire power amplifier 9. To ensure the correct operation of the output offset protection circuit 8, always place the thermal shutdown circuit away from the power transistor inside the operational amplifier 2A and 2B.

Figure 4:
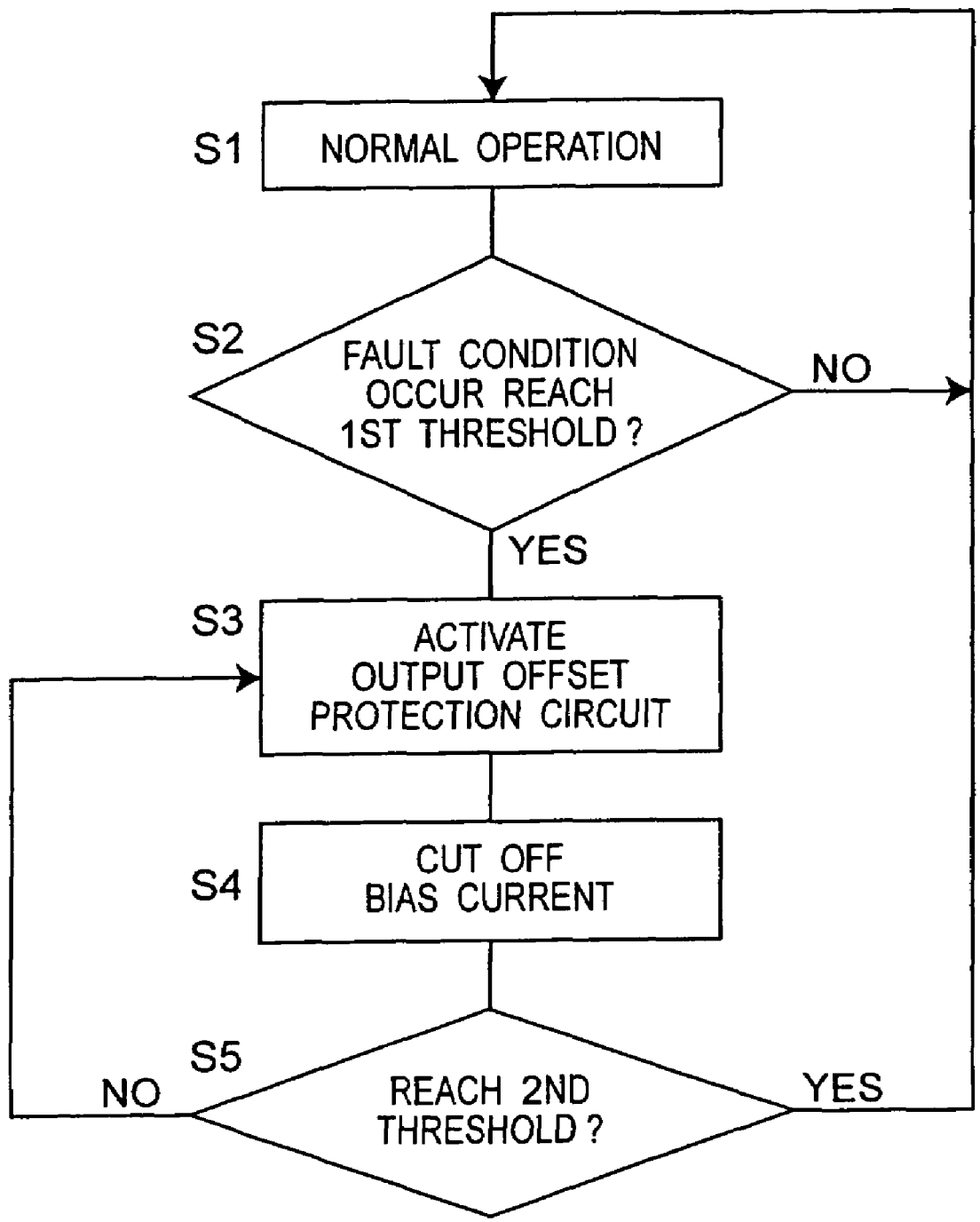
FIG. 4 is a flow chart showing an operation of the power amplifier with the output offset protection circuit according to the present invention.
Figure 5:
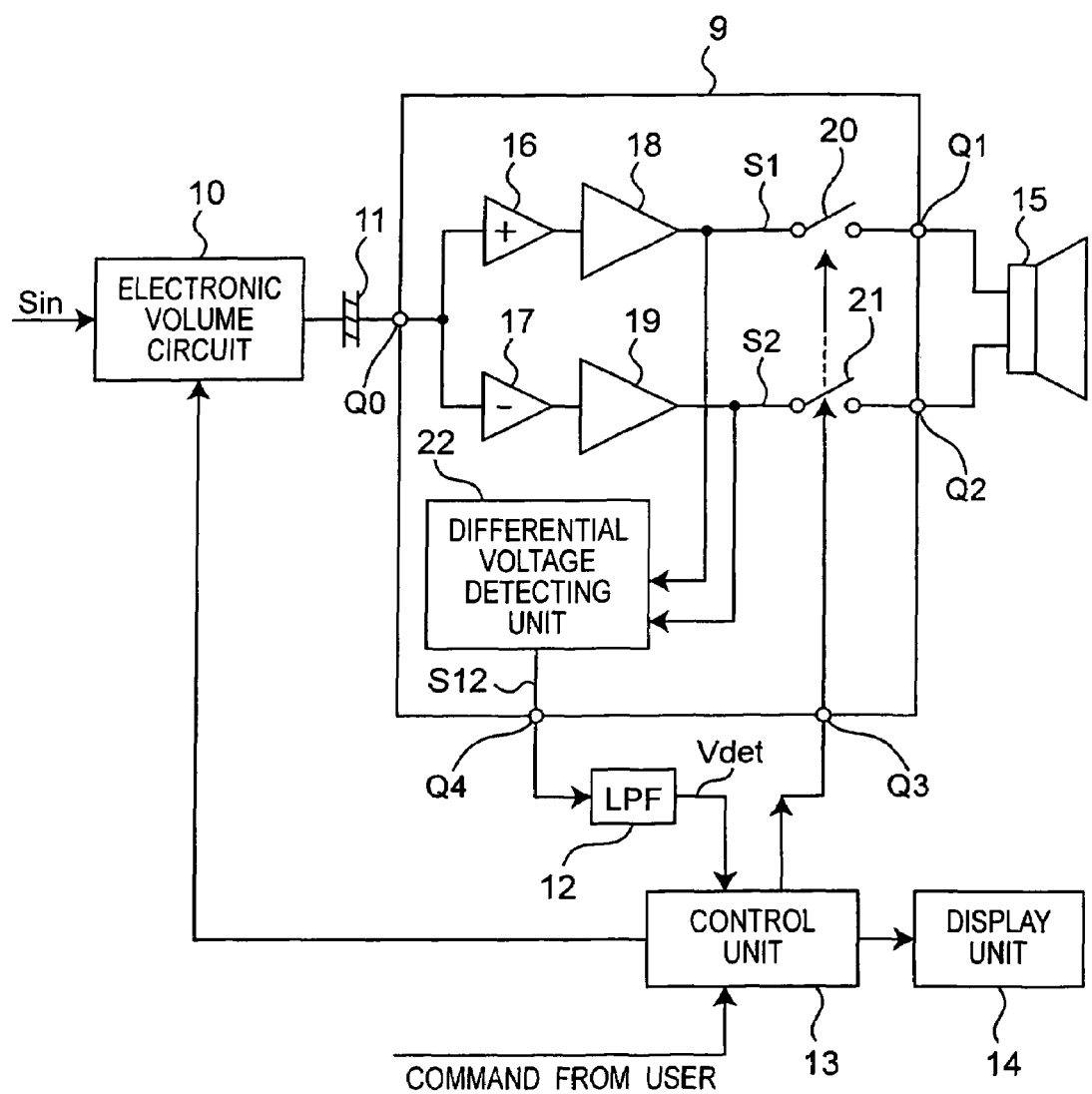
FIG. 5 is a block diagram of a conventional audio power amplifier with a protection arrangement.

FIG. 4 shows a flow chart of the output offset protection for the power amplifier 9.

Step S1:
During normal operation, the temperature sensors detect the temperature of the power transistors.

$$(I_{C(Q1)} < I_{C(Q4)}, I_{C(Q2)} < I_{C(Q4)})$$

Step S2:
The judging device 82 is set with pre-determined threshold level of the output offset protection circuit. In the case where the detected temperature exceeds the 1st threshold level (Vth1) of the offset protection circuit ($I_{C(Q1)} \geq I_{C(Q4)}$ or $I_{C(Q2)} \geq I_{C(Q4)}$), the process proceeds to the next Step S3 otherwise repeats Step S1.

Step S3:
The cutoff block 83 sends the cutoff signal Sc to the protection switch block 71 thereby activating the protection switch block 71 to generate a control singal and activating the hysteresis block 84.

Step S4:
The protection switch block 71 produces the control signal to turn off the protection switch 7A, thereby cutting off the bias currents from the bias block 4 to the output block 2. Then, the power transistors are both maintained in the OFF states. Thereafter its temperature will be reduced.

Step S5:
Monitor the detected temperature for recovery if it still exceeds the 2nd threshold level (Vth2) of the output offset protection circuit ($I_{C(Q1)} < I_{C(Q4)}$ or $I_{C(Q2)} < I_{C(Q4)}$). The process proceeds back to Step S1 if the power transistors have cooled down, otherwise repeats Step S3.

The above-described disclosure of the invention in terms of the presently preferred embodiments is not to be interpreted as intended for limiting. Various alterations and modifications will no doubt become apparent to those skilled in the art to which the invention pertains, after having read the disclosure. As a corollary to that, such alterations and modifications apparently fall within the true spirit and scope of the invention. Furthermore, it is to be understood that the appended claims be intended as covering the alterations and modifications.

What is claimed is:

1. A power amplifier circuit having a protection circuit comprising:
    a first power transistor provided in a first amplifier (2A);
    a second power transistor provided in a second amplifier (2B);
    a bias block (4) operable to provide a bias signal to said first and second amplifiers;
    a protection switch (7A) provided in a path for sending the bias signal;
    a protection switch block (71) operable to provide a control signal to the protection switch (7A); and
    an output offset protection circuit (8) operable to provide a cutoff signal (Sc) which causes the generation of said control signal, said output offset protection circuit (8) comprising:
    a first temperature sense transistor (Q1) located near said first power transistor to generate a first temperature sense signal when said first power transistor is heated above a predetermined temperature;
    a second temperature sense transistor (Q2) located near said second power transistor to generate a second temperature sense signal when said second power transistor is heated above predetermined temperature; and a cutoff block (83) for generating a cutoff signal (Sc) when at least one of said first and second temperature sense transistors generates at least one of said first and second temperature sense signals.

2. A power amplifier circuit according to claim 1 wherein said output offset protection circuit (8) further comprises:
   a judging device (82) that determines a predetermined turn-on temperature for turning on said first and second temperature sense transistors.

3. A power amplifier circuit according to claim 1 wherein said output offset protection circuit (8) further comprises:
   a hysteresis block (84) operable to provide a bypass circuit for the first and second temperature sense transistors thereby determining a predetermined turn-off temperature for turning off said first and second temperature sense transistors, said predetermined turn-off temperature being lower than said predetermined temperature.

4. A power amplifier circuit having a protection circuit comprising:
   a power transistor provided in an amplifier (2A);
   a bias block (4) operable to provide a bias signal to said amplifiers;
   a protection switch (7A) provided in a path for sending the bias signal;
   an output offset protection circuit (8) operable to provide a cutoff signal (Sc) which causes the turn on and off of said protection switch, said output offset protection circuit (8) comprising:
      a temperature sense transistor (Q1) located near said power transistor to generate a temperature sense signal when said power transistor is heated above a predetermined temperature; and
      a cutoff block (83) for generating a cutoff signal (Sc) when said temperature sense transistor generates said temperature sense signal.

5. A power amplifier circuit according to claim 4 wherein said output offset protection circuit (8) further comprises:
   a judging device (82) that determines a predetermined turn-on temperature for turning on said temperature sense transistor.

6. A power amplifier circuit according to claim 4 wherein said output offset protection circuit (8) further comprises:
   a hysteresis block (84) operable to provide a bypass circuit for the temperature sense transistor thereby determining a predetermined turn-off temperature for turning off said temperature sense transistor, said predetermined turn-off temperature being lower than said predetermined temperature.

* * * * *